United States Patent
Spirkl et al.

(10) Patent No.: US 7,649,130 B2
(45) Date of Patent: Jan. 19, 2010

(54) INTEGRATED CIRCUIT

(75) Inventors: Wolfgang Spirkl, Germering (DE); Gunter Schmid, Hemhofen (DE)

(73) Assignee: Infineon Technologies AG, Neubiberg (DE)

( * ) Notice: Subject to any disclaimer, the term of this patent is extended or adjusted under 35 U.S.C. 154(b) by 769 days.

(21) Appl. No.: 11/329,363

(22) Filed: Jan. 9, 2006

(65) Prior Publication Data
US 2006/0170483 A1  Aug. 3, 2006

Related U.S. Application Data

(63) Continuation of application No. PCT/EP2004/007317, filed on Jul. 5, 2004.

(30) Foreign Application Priority Data
Jul. 8, 2003  (DE) .............. 103 30 825

(51) Int. Cl.
*H03K 19/096* (2006.01)

(52) U.S. Cl. ............ 977/783; 977/791; 326/104; 326/93

(58) Field of Classification Search .......... 326/104, 326/93–98; 977/783, 791; 438/99
See application file for complete search history.

(56) References Cited

U.S. PATENT DOCUMENTS

| | | | |
|---|---|---|---|
| 4,602,353 A * | 7/1986 | Wawersig et al. | 365/189.05 |
| 4,710,648 A * | 12/1987 | Hanamura et al. | 326/32 |
| 4,896,057 A * | 1/1990 | Yang et al. | 326/116 |
| 6,528,816 B1 | 3/2003 | Jackson et al. | |
| 7,078,937 B2 * | 7/2006 | Baude et al. | 326/112 |
| 2003/0085665 A1 | 5/2003 | Yoo | |

FOREIGN PATENT DOCUMENTS

| | | |
|---|---|---|
| EP | 1 132 882 A2 | 9/2001 |
| JP | 62-112419 A | 5/1987 |
| WO | WO 93/25003 A1 | 12/1993 |
| WO | WO 99/66551 A1 | 12/1999 |

OTHER PUBLICATIONS

Patent Abstracts of Japan, vol. 11, No. 325 (E-551), Oct. 22, 1987 & JP 62 112429 A (Mitsubishi Electric Corp).

Song, Bao-Yo, et al.; "Low-Power Scheme of NMOS 4-Phase Dynamic Logic"; IEICE Transactions on Electronics, Institute of Electronics Information and Comm. Eng. Tokyo, Japan; vol. E82-C, No. 9, Sep. 1999, pp. 1772-1776.

* cited by examiner

*Primary Examiner*—Vibol Tan
(74) *Attorney, Agent, or Firm*—Dickstein Shapiro LLP

(57) ABSTRACT

An integrated circuit produced from non-monocrystalline semiconductors, including a plurality of transistors, all of the transistors being of the same type, and at least two timer signal inputs, wherein the timer signals fed to the different inputs are temporally non-overlapping signals.

13 Claims, 2 Drawing Sheets

INTEGRATED CIRCUIT

CROSS-REFERENCE TO RELATED APPLICATION

This application is a continuation of International Patent Application Serial No. PCT/EP2004/007317 filed on Jul. 5, 2004, which claims priority to German Patent Application Serial No. 103 30 825.3, which was filed on Jul. 8, 2003. Both of these applications are incorporated herein by reference in their entireties.

FIELD OF THE INVENTION

The present invention relates to an integrated circuit which is essentially produced from organic semiconductors.

BACKGROUND OF THE INVENTION

It is known to produce integrated circuits from organic semiconductors. On account of the properties of the organic semiconductors, however, it is not possible to transfer all the elements of integrated circuits that are known from CMOS technology to circuits made of organic semiconductors. For this reason, complicated equivalent circuits are used. However, the latter have the disadvantage that the complexity of the circuit is increased and the propagation time delay thus increases. A supply voltage that is often more than twice as high as in the case of CMOS circuits is furthermore required. Moreover, the speed is limited by the small current of the first load transistor, which charges the gate of the last driver transistor. Finally, a static power consumption has also been observed and the noise sensitivity is increased.

SUMMARY OF THE INVENTION

It is an object of the present invention to provide an integrated circuit made of organic semiconductors which has a simple construction.

The invention provides an integrated circuit which is essentially produced from non-monocrystalline semiconductors, having a plurality of transistors, all of the transistors being of the same type, and at least two timer signal inputs or clock inputs, wherein the timer signals or clock signals fed to the different inputs are temporally non-overlapping signals.

BRIEF DESCRIPTION OF THE DRAWINGS

Further features (objects and advantages of the present invention) will become apparent from the description of preferred embodiments of the present invention with reference to the drawings, in which.

DETAILED DESCRIPTION OF PREFERRED EMBODIMENTS OF THE INVENTION

Two preferred embodiments of the invention which are produced from essentially organic semiconductors are described with reference to the figures. Further semiconductors which may be used according to the invention are specified after the following description.

Figure 1:
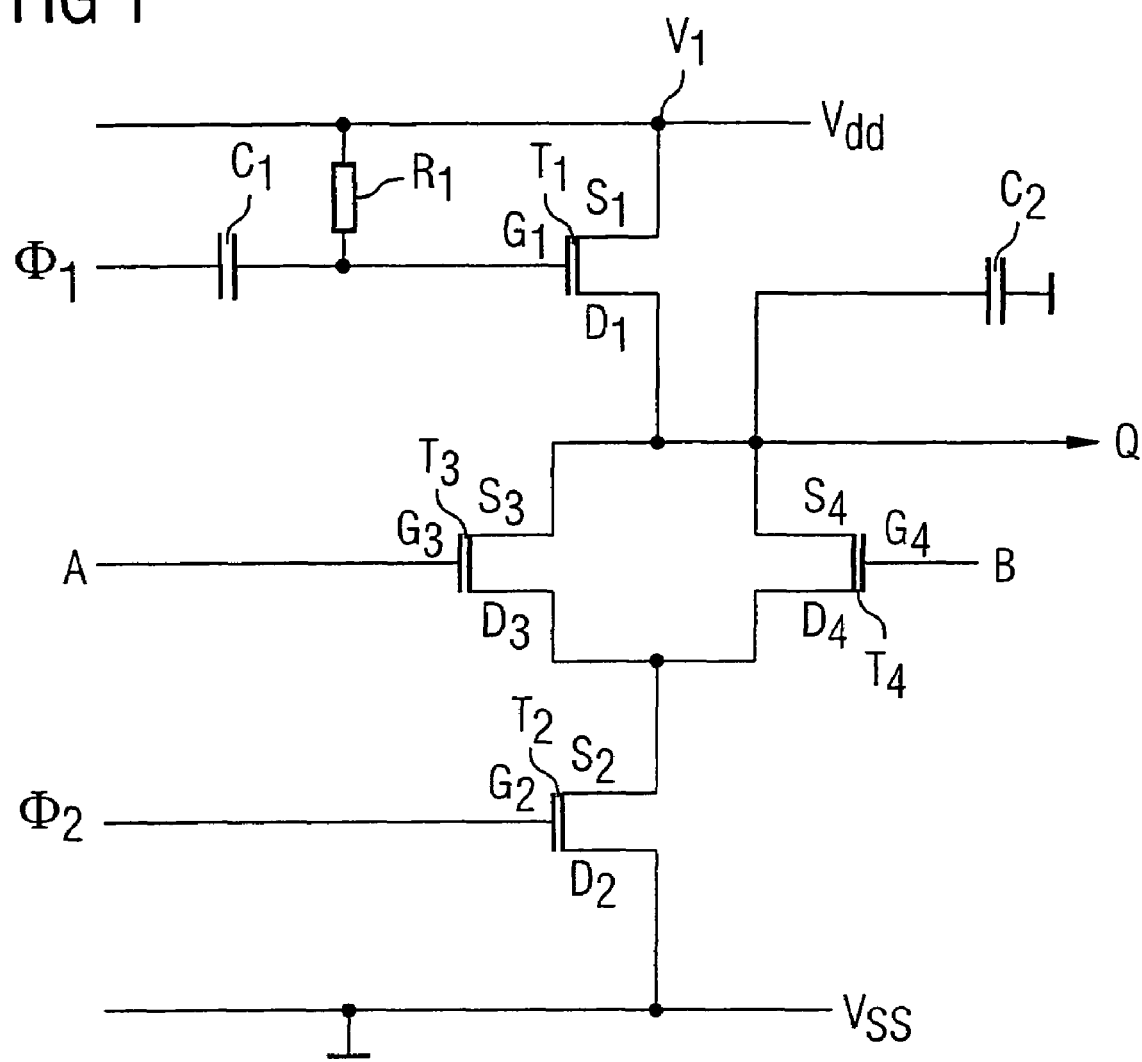
FIG. 1 shows part of an integrated circuit in accordance with a first preferred embodiment of the present invention.

A circuit in accordance with a first preferred embodiment of the present invention is described in detail below with reference to FIG. 1. FIG. 1 shows the realization of a NOR gate based on a dynamic logic. Four p-channel transistors T1, T2, T3 and T4 are provided in the circuit shown in FIG. 1. The four transistors each have a gate terminal G1, G2, G3 G4, a source terminal S1, S2, S3, S4 and a drain terminal D1, D2, D3, D4. Two capacitors C1, C2 and a resistor R1 are furthermore provided in the circuit. Two non-overlapping timer signals are fed to the circuit via two timer signal inputs $\Phi 1$, $\Phi 2$. Non-overlapping signals are in this case to be understood as signals in the case of which only one of the signals has a pulse at a specific point in time. This means, in particular, that at a specific point in time only the circuit part that is signal-connected to the respective timer signal input receives a clock pulse. Consequently, two clock signals or a two-phase logic is present.

Furthermore, the circuit has two signal inputs A, B, a signal output Q and a supply voltage terminal V1.

The gate terminal G1 of the first transistor T1 is signal-connected to the first timer signal input $\Phi 1$ via the first capacitor C1 and to the supply voltage terminal V1 via the resistor R1. The source terminal S1 of the first transistor T1 is preferably signal-connected directly to the supply voltage terminal V1. Furthermore, the drain terminal D1 of the first transistor T1, the source terminal S3 of the third transistor T3, the source terminal S4 of the fourth transistor T4 and the signal output Q are signal-connected to one another. The drain terminal D1 of the first transistor T1 is grounded via the second capacitor C2.

The first signal input A is signal-connected to the gate terminal G3 of the third transistor T3. The second signal input B is signal-connected to the gate terminal G4 of the fourth transistor T4.

The drain terminal D3 of the third transistor T3, the drain terminal D4 of the fourth transistor T4 and the source terminal S2 of the second transistor T2 are signal-connected to one another.

The gate terminal G2 of the second transistor T2 is signal-connected to the second timer signal input $\Phi 2$. Furthermore, the drain terminal D2 of the second transistor T2 is grounded.

The operation of the circuit shown in FIG. 1 is described below.

By means of a pulse at the first timer signal input $\Phi 1$, the first transistor T1 is turned on, as a result of which the capacitance C2 is precharged to the supply voltage VDD. In the case of a subsequent pulse at the second timer signal input $\Phi 2$, the second transistor T2 is turned on. If a high signal or "1" or the supply voltage VDD is present at the first signal input A, the third transistor T3 is turned on, the capacitance C2 being discharged. The output signal which is then present at the signal output Q is consequently "low" or "0" or the voltage VSS corresponding to the grounding.

If a high signal or the supply voltage VDD is present at the second signal input B, the fourth transistor T4 is turned on and the capacitance C2 is likewise discharged. As a consequence, the output signal present at the signal output Q is likewise "0" or low. The above likewise holds true if a high signal is present both at the first signal input A and at the second signal input B.

It is only in the case if a low signal or "0" is present both at the first signal input A and at the second signal input B that the capacitor C2 is not discharged and the signal present at the signal output Q is equal to VDD or "1". Consequently, a NOR gate with a dynamic circuit logic is formed by the circuit illustrated in FIG. 1 with the aid of the multiphase logic.

A second preferred embodiment of the present invention is described below with reference to FIG. 2.

Figure 2:
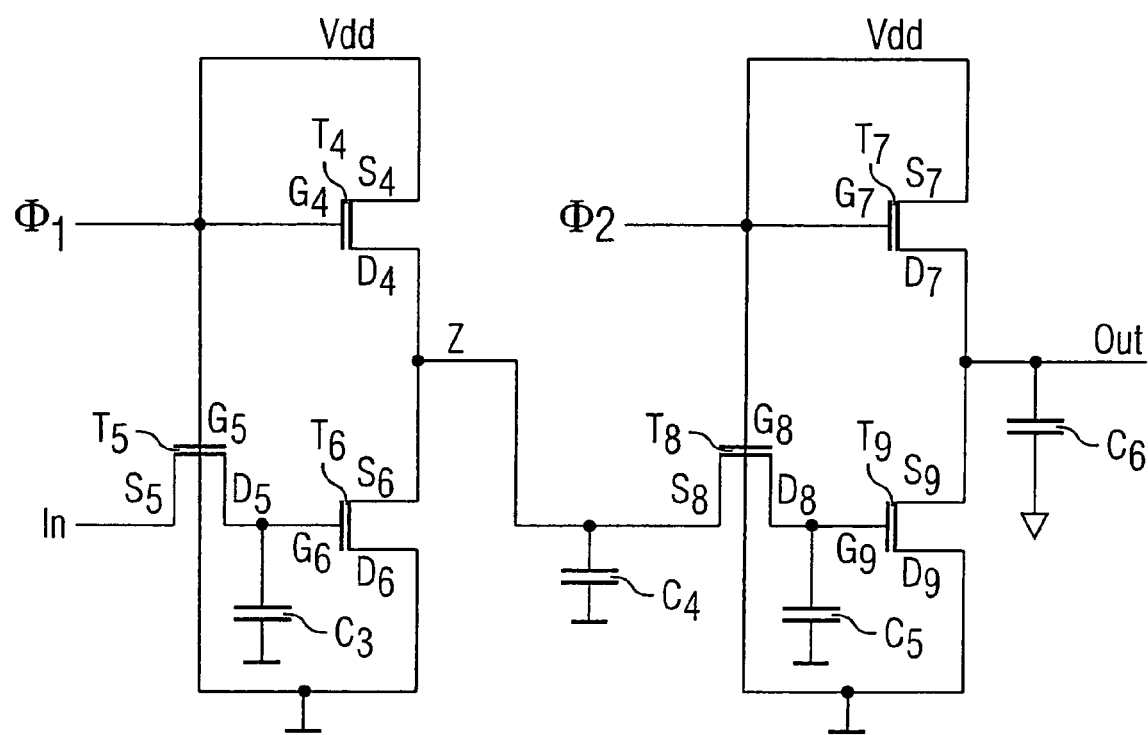
FIG. 2 shows part of a circuit of an integrated circuit in accordance with a second preferred embodiment of the present invention.

The circuit shown in FIG. 2 comprises six p-channel transistors T4-T9 and four capacitors C3 to C6. Two timer signal inputs Φ1 and Φ2, a signal input IN and a signal output OUT are furthermore provided.

The construction of the circuit in accordance with the second embodiment of the present invention is described in detail below with reference to FIG. 2.

The first timer signal input Φ1 is signal-connected to the gate terminal G4 of the transistor T4 and the gate terminal G5 of the transistor T5. Furthermore, the source terminal S4 of the transistor T4 is connected to the supply voltage VDD. The drain terminal D4 of the transistor T4 is signal-connected to an intermediate signal output Z and the source terminal S6 of the transistor T6.

The source terminal S5 of the transistor T5 is signal-connected to the signal input IN and the drain terminal D5 of the transistor T5 is signal-connected to the gate terminal G6 of the transistor T6 and the capacitor C3. The second terminal of the capacitor C3 is grounded. The drain terminal D6 of the transistor T6 is likewise grounded.

The second timer signal input Φ2 is signal-connected to the gate terminal G7 of the transistor T7 and the gate terminal G8 of the transistor T8. The source terminal S7 of the transistor T7 is connected to the supply voltage VDD. The drain terminal D7 of the transistor T7 is signal-connected to the signal output OUT, the source terminal S9 of the transistor T9 and a capacitor C6. The second terminal of the capacitor C6 is grounded. The source terminal S8 of the transistor T8 is signal-connected to the intermediate signal output Z and a capacitor C4. The second terminal of the capacitor C4 is grounded. The drain terminal D8 of the transistor T8 is signal-connected to the gate terminal G9 of the transistor T9 and a capacitor C5. The second terminal of the capacitor C5 is grounded. The drain terminal D9 of the transistor T9 is likewise grounded.

The operation of the circuit described above is described below.

A pulse present at the first timer signal input Φ1 turns the transistors T4 and T5 on. Consequently, the input signal present at the signal input IN is present at the gate terminal G6 of the transistor T6. The transistor T6 is or is not turned on depending on the input signal. If the input signal is a high signal or "1", the transistor T6 is turned on and a low signal or "0" is present at the intermediate signal output Z. If, by contrast, the input signal is a low signal, the transistor T6 remains in its off state and a high signal is present at the intermediate signal output. Consequently, the inverse of the input signal is always present at the intermediate signal output Z.

The capacitor C4 is charged by the signal present at the intermediate signal output Z. Consequently, the signal present at the intermediate signal output Z can be stored by the capacitor C4 for a short time. If a pulse is present at the second timer signal input Φ2, the transistors T7 and T8 are turned on. The transistor T9 is or is not turned on depending on the intermediate signal present at the intermediate signal output Z. If a high signal is present at the intermediate signal output Z, the transistor T9 is turned on and the output signal present at the signal output OUT becomes low or "0". If, by contrast, a low signal is present at the intermediate signal output A1, the transistor T9 remains in the off state and a high signal or "1" is present at the signal output OUT. Consequently, the output signal present at the signal output OUT is an inverse of the intermediate signal output Z or equal to the input signal that had been applied at the signal input IN at the start of the cycle or the phase. Consequently, a phase shifter can be realized by the circuit illustrated in FIG. 2.

The capacitors used in the circuits illustrated can store a signal for a short time period. The capacitor is preferably used as a signal buffer store for momentarily storing internal signals of the integrated circuit. The storage duration is preferably a few nsec to msec. In one preferred embodiment, the semiconductors are organic semiconductors. A dynamic logic circuit with a multiphase operation is thus formed.

With the aid of the integrated circuit according to the invention, preferably made of organic semiconductors, circuits having only one type of transistor can be realized in a simple manner. In particular, it is possible to realize circuits which have only p-channel transistors and nevertheless have a low complexity and minor requirements made of the supply voltage. Transistors which would be n-channel transistors in a complementary logic may preferably be replaced by a capacitively coupled p-channel transistor, the gate voltage preferably being capacitively coupled. Consequently, a dynamic multiphase logic is preferably realized.

In the circuit arrangement according to the invention, the magnitude of the supply voltage is limited only by the gate-source voltage required for the output signal or the magnitude of the gate-source voltage required for the output signal.

The organic semiconductors used are preferably low molecular weight or polymeric semiconductors. Organic semiconductors which are used in a particularly preferred embodiment of the invention are described in the publication "Polymer Gate Dielectric Pentacene TFTs and Circuits on Flexible Substrates" by H. Klauk, M. Halik, U. Zschieschang, G. Schmid, W. Radlik, R. Brederlow, S. Briole, C. Pacha, R. Thewes, and W. Weber, published in 2002 International Electron Devices Meeting Technical Digest, pages 557 560, December 2002, which, with regard to the semiconductors used, is regarded as being disclosed herein to the extent of its entire contents. One preferred organic semiconductor of polymeric nature is e.g. polythiophene. Further preferred polymers are regioregular poly(3-alkyl)thiophenes, preferred alkyl groups (hexyl, octyl), polyvinylthiophenes, polypyrroles and derivatives thereof.

Preferred low molecular weight organic semiconductors are e.g. phthalocyanine, anthracene, tetracene, pentacene, oligothiophenes (substituted, unsubstituted), for example α, ω bis-decylsexiothiophene, naphthalenetetracarboxylic dianhydride, naphthalenetetracarboxylic diimide and its derivatives.

In the sense of this application, organometallic semiconductors are understood to be organic semiconductors. Preferred organometallic semiconductors are Cu-phthalocyanine, perfluoro-cu-phthalo-cyanine, metal porphyrin derivatives, $(C_6H_5C_2H_4NH_3)_2SnI_4$, derivatives of Magnus' salts $[Pt(NH_3)_4]$ $[PtCl_4]$ for example $[Pt(NH_2democ)_4]$ $[PtCl_4]$. Organometallic semiconductors which are used in a particularly preferred embodiment of the invention are described in the publications "(Hot-) Waterproof", Semiconducting, Platinum-based Chain Structures: Processing, Products, and Properties" by W. R. Caseri et al., published in Advanced Materials 2003, 15, No. 2, January 16, pp. 125-129 and "Organic-Inorganic Hybrid Materials as Semiconducting Channels in Thin-Film Field-Effect Transistors" by C. R. Kagan et al., published in Science, Vol. 286, Oct. 29, 1999, pages 945-947, which, with regard to the semiconductors used, are regarded as disclosed herein in terms of the entire contents.

Further preferred semiconductors in the sense of this application are optionally inorganic semiconductors, which are preferably surface-functionalized, non-monocrystalline semiconductors. Such semiconductors are preferably surface functionalized "nanoparticles" of inorganic nature such as e.g. CdSe, Si, GaAs, ZnO, $TiO_2$ ruthenium oxides, etc.

Non-monocrystalline semiconductors, particularly preferably organic semiconductors, are used for the present invention. The decoupling between electrical functionality and carrier material is important in this case. In contrast to this, carrier material and electrical functionality are inseparably linked in the case of monocrystalline semiconductors. Preferably, the semiconductors used can be deposited in principle on any substrate (plastic films, paper, etc.). The thus newly acquired flexibility in choice of substrate, production technology and applicability affords new advantages.

What is claimed is:

1. An integrated circuit with a multiphase operation, comprising:
    a plurality of transistors, all of the transistors being of the same type;
    at least two timer signal inputs including a first timer signal input and a second timer signal input; and
    a capacitor configured as a signal buffer store for momentarily storing an internal signal of the integrated circuit at least for a storage duration between a timer signal pulse at the first timer signal input and a timer signal pulse at the second timer signal input that does temporally not overlap with the pulse at the first timer signal input,
    wherein the integrated circuit is produced from non-monocrystalline semiconductors.

2. The integrated circuit as claimed in claim 1, further comprising at least one supply voltage terminal for receiving a supply voltage and at least one signal output for outputting an output signal, wherein the magnitude of the supply voltage is essentially equal to the voltage required for the output signal.

3. The integrated circuit as claimed in claim 1, wherein all of the transistors are p-channel transistors.

4. The integrated circuit as claimed in claim 1, further comprising at least one capacitor for buffer-storing signals.

5. The integrated circuit as claimed in claim 1, wherein the semiconductors are organic semiconductors.

6. The integrated circuit as claimed in claim 5, wherein the organic semiconductors are molecular semiconductors.

7. The integrated circuit as claimed in claim 5, wherein the organic semiconductors are polymer semiconductors.

8. The integrated circuit as claimed in claim 2, wherein the non-monocrystalline semiconductors are inorganic semiconductors, which are surface-functionalized.

9. The integrated circuit as claimed in claim 8, wherein the semiconductors are surface-functionalized nanoparticles of inorganic nature.

10. The integrated circuit as claimed in claim 2, which forms a NOR gate.

11. The integrated circuit as claimed in claim 10, comprising:
    first to fourth transistors, each having a gate terminal, a source terminal and a drain terminal;
    first and second capacitors;
    a resistor;
    first and second timer signal inputs; and
    first and second signal inputs,
    wherein
        the gate terminal of the first transistor is signal-connected to the first timer signal input via the first capacitor and to the supply voltage terminal via the resistor,
        the source terminal of the first transistor is signal-connected to the supply voltage terminal,
        the drain terminal of the first transistor, the source terminal of the third transistor, the source terminal of the fourth transistor and the signal output are signal-connected to one another,
        the drain terminal of the first transistor is grounded via the second capacitor,
        the first signal input is signal-connected to the gate terminal of the third transistor,
        the second signal input is signal-connected to the gate terminal of the fourth transistor,
        the drain terminal of the third transistor, the drain terminal of the fourth transistor and the source terminal of the second transistor are signal-connected to one another,
        the gate terminal of the second transistor is signal-connected to the second timer signal input, and
        the drain terminal of the second transistor is grounded.

12. The integrated circuit as claimed in claim 1, which forms a phase shifter.

13. The integrated circuit as claimed in claim 12, comprising:
    first to sixth p-channel transistors;
    first to fourth capacitors;
    first and second timer signal inputs;
    a signal input; and
    a signal output,
    wherein
        the first timer signal input is signal connected to the gate terminal of the first transistor and the gate terminal of the second transistor,
        the source terminal of the first transistor is connected to the supply voltage,
        the drain terminal of the first transistor is signal connected to an intermediate signal output and the source terminal of the third transistor,
        the source terminal of the second transistor is signal connected to the signal input,
        the drain terminal of the second transistor is signal connected to the gate terminal of the third transistor and the first terminal of the first capacitor,
        the second timer signal input is signal connected to the gate terminal of the fourth transistor and the gate terminal of the fifth transistor,
        the source terminal of the fourth transistor is connected to the supply voltage,
        the drain terminal of the fourth transistor is signal connected to the signal output, the source terminal of the sixth transistor and the first terminal of the fourth capacitor,
        the source terminal of the fifth transistor is signal connected to the intermediate signal output and the first terminal of the second capacitor,
        the drain terminal of the fifth transistor is signal connected to the gate terminal of the sixth transistor the first terminal of the third capacitor, and
    the second terminal of the first capacitor, the drain terminal of the third transistor, the second terminal of the fourth capacitor, the second terminal of the second capacitor, the second terminal of the third capacitor and the drain terminal of the sixth transistor are each grounded.

* * * * *

UNITED STATES PATENT AND TRADEMARK OFFICE
CERTIFICATE OF CORRECTION

PATENT NO.      : 7,649,130 B2                                       Page 1 of 1
APPLICATION NO. : 11/329363
DATED           : January 19, 2010
INVENTOR(S)     : Spirkl et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1047 days.

Signed and Sealed this

Twenty-third Day of November, 2010

David J. Kappos
*Director of the United States Patent and Trademark Office*